US010560117B2

(12) United States Patent
Gaubatz et al.

(10) Patent No.: US 10,560,117 B2
(45) Date of Patent: Feb. 11, 2020

(54) GROUPS OF PHASE INVARIANT CODEWORDS

(71) Applicant: Hewlett-Packard Development Company, L.P., Fort Collins, CO (US)

(72) Inventors: Matthew D Gaubatz, Seattle, WA (US); Robert Ulichney, Stow, MA (US); Steven J Simske, Fort Collins, CO (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 0 days.

(21) Appl. No.: 16/217,721

(22) Filed: Dec. 12, 2018

(65) Prior Publication Data

US 2019/0123765 A1 Apr. 25, 2019

Related U.S. Application Data

(63) Continuation of application No. 15/114,398, filed as application No. PCT/US2014/014066 on Jan. 31, 2014, now Pat. No. 10,171,107.

(51) Int. Cl.

| | |
|---|---|
| ***H03M 13/05*** | (2006.01) |
| ***H03M 13/00*** | (2006.01) |
| ***G11B 20/14*** | (2006.01) |
| ***G06K 19/06*** | (2006.01) |
| *H03M 7/00* | (2006.01) |

(52) U.S. Cl.

CPC ...... *H03M 13/05* (2013.01); *G06K 19/06046* (2013.01); *G11B 20/14* (2013.01); *G11B 20/1403* (2013.01); *G11B 20/1407* (2013.01); *H03M 13/6362* (2013.01); *H03M 7/00* (2013.01)

(58) Field of Classification Search

CPC .... H03M 13/05; H03M 13/6362; H03M 7/00; H03M 13/005; G06K 19/06046; G11B 20/14; G11B 20/1403; G11B 20/1407

USPC ......................... 714/776, 757, 762, 774, 779

See application file for complete search history.

(56) References Cited

U.S. PATENT DOCUMENTS

| | | | | |
|---|---|---|---|---|
| 4,916,702 | A * | 4/1990 | Berlekamp | H03M 13/17 714/762 |
| 6,272,257 | B1 | 8/2001 | Prokop | |
| 6,346,897 | B1 | 2/2002 | Roh | |
| 6,640,327 | B1 * | 10/2003 | Hallberg | H03M 13/152 714/758 |
| 6,915,020 | B2 | 7/2005 | Damera-Venkata | |

(Continued)

FOREIGN PATENT DOCUMENTS

WO WO-2015041684 3/2015

OTHER PUBLICATIONS

Henkel, Phase-Invariant Coded Phase Shift Keying Using Reed-Muller Codes, Nov. 8, 1991, Research Institute of Bundespost, Telekom, pp. 125-130. (Year: 1991).*

(Continued)

*Primary Examiner* — John J Tabone, Jr.

(74) *Attorney, Agent, or Firm* — HP Inc. Patent Department

(57) ABSTRACT

Disclosed herein are a system, non-transitory computer-readable medium, and method for encoding and decoding information on a data bearing medium. A message comprising a bit string is read. A plurality of substrings in the message may be associated with a phase invariant codeword.

15 Claims, 4 Drawing Sheets

100

(56) References Cited

U.S. PATENT DOCUMENTS

| | | | | |
|---|---|---|---|---|
| 6,961,387 | B2 * | 11/2005 | Kim | H04J 13/004 375/262 |
| 7,760,822 | B1 * | 7/2010 | Burd | G11B 20/1833 375/341 |
| 8,027,510 | B2 | 9/2011 | Rhoads | |
| 8,363,282 | B2 | 1/2013 | Damera-Venkata | |
| 2005/0094844 | A1 | 5/2005 | Damera-Venkata | |
| 2008/0075176 | A1 | 3/2008 | Karr | |
| 2010/0040255 | A1 | 2/2010 | Rhoads | |
| 2011/0303748 | A1 | 12/2011 | Lemma | |
| 2013/0044948 | A1 | 2/2013 | Gaubatz | |
| 2016/0217358 | A1 * | 7/2016 | Gaubatz | G06F 3/00 |

OTHER PUBLICATIONS

Lien et al. "Hiding Data in Ordered Dithering Halftone Images by Bit Interleaving," Nov. 26-28, 2007, pp. 1-4, IEEE, Available at: <ieeexplore.ieee.org/xpl/login.jsp?tp=&arnumber=4457554&url=http%3A%2F%2Fieeexplore.ieee.org%2Fxpls%2Fabs_all.jsp%3Farnumber%3D4457554>.

Pan, et al. "Look-up Table Based Reversible Data Hiding for Error Diffused Halftone Images," Apr. 2006, Further published: Informatica, 2007, pp. 615-628, vol. 18, No. 4, Available at: <mii.lt/Informatica/pdf/INFO691.pdf>.

Ulichney et al. "Circular Coding for Data Embedding", Proceedings of the 29th International Conference on Digital Printing Technologies, Sep. 29, 2013 (Sep. 29, 2013), pp. 142-147, XP009194536, Seattle, WA * the whole document *.

* cited by examiner

300

302 304

| | Phase Invariant Codeword | Substring |
|---|---|---|
| 306 | 0000000<br>1000000<br>1010000<br>1001000 | 00<br>01<br>10<br>11 |
| 308 | 1100010<br>1101000<br>1100100<br>1010100 | 00<br>01<br>10<br>11 |
| 310 | 1110010<br>1101100<br>1110100<br>1001010 | 00<br>01<br>10<br>11 |
| 312 | 1111010<br>1110110<br>1111110<br>1111111 | 00<br>01<br>10<br>11 |

*Fig. 3*

GROUPS OF PHASE INVARIANT CODEWORDS

CROSS REFERENCE TO RELATED APPLICATIONS

This application is a continuation of U.S. application Ser. No. 15/114,398, filed Jul. 27, 2016, which is a 371 application of PCT Application No. PCT/US2014/014066, filed Jan. 31, 2014. The contents of both U.S. application Ser. No. 15/114,398 and PCT Application No. PCT/US2014/014066 are incorporated herein by reference in their entirety.

BACKGROUND

Technologies for enabling data-bearing media afford a number of interesting applications, including labels, packaging, signage, and documents in general. Non-limiting examples of data-bearing media may include data-bearing magnetic media (e.g., magnetic storage), data-bearing optical media (e.g., optical storage), data-bearing atomic media (e.g., atomic storage), or data-bearing images.

BRIEF DESCRIPTION OF THE DRAWINGS

FIG. 3 is a working example of a lookup table in accordance with aspects of the present disclosure.

DETAILED DESCRIPTION

Figure 1:
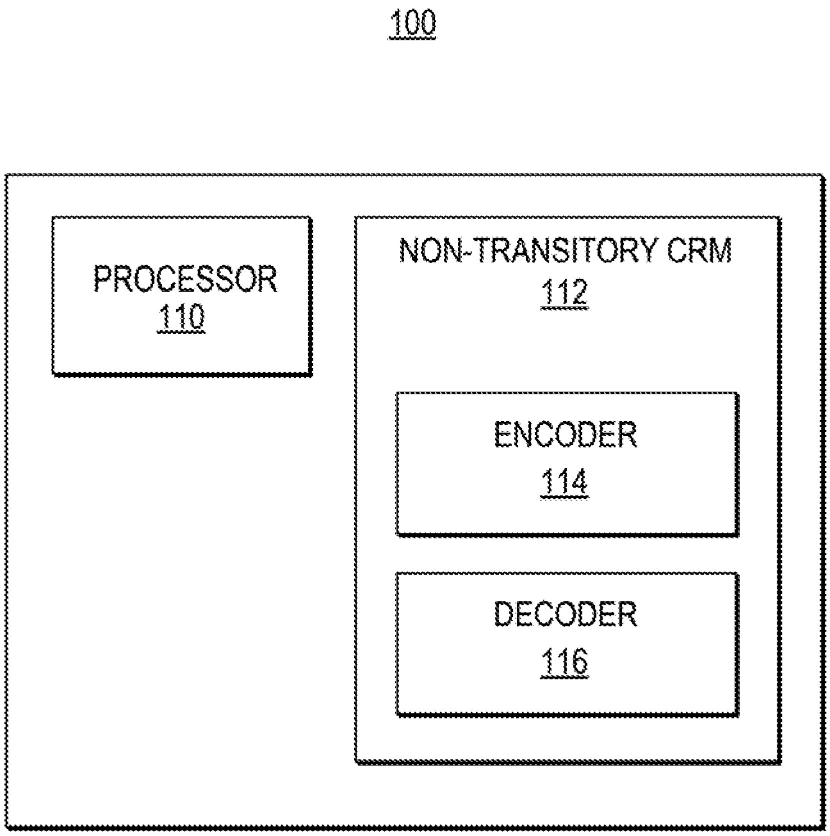
FIG. 1 is an example system in accordance with aspects of the present disclosure.

One approach for enabling data bearing properties may be encoding information in a recoverable or readable manner in a halftone image. Halftone screening techniques represent one of the methods used in printing technologies heretofore to improve the quality of printed pieces. These techniques may improve the aesthetic qualities and fidelity of printed reproductions. Clustered-dot halftoning converts the original image into a series of dot clusters of varying size to simulate tonal difference, displaying detail in the image. In highlighted regions, darker areas of the image may be printed with larger dot dusters and lighter areas may be printed with smaller dot clusters. These different sized dots absorb the light reflecting from the paper in varying amounts, thereby giving the illusion of different shades of gray while printing with only black ink.

Some techniques allow messages to be encoded throughout an image such that the original message is recoverable when only a subset or window of that image is examined. In one example, a codeword may be defined as a set of symbols, such as bits, representing a message. In another example, a phase invariant codeword may be defined as a set of symbols in which every circularly shifted version of the set represents the same message. By way of example, 101, 110 and 001 are all circularly shifted versions of 101. In one example implementation, a structured array of data-bearing elements of a data-bearing medium represents an array of bits. A certain number of the bits in such an array may represent a phase invariant codeword and may repeat such that positions of the bits in each line (e.g., rows or columns) are circularly shifted from positions of the bits in an immediately preceding line. This approach allows a portion of the data-bearing medium to include at least a shifted version of a set of bits representing a message such that there is no need to synchronize the codewords (i.e., locate the start or end of any subsequence of bits) in order to interpret the data in a given window of the data-bearing medium.

Unfortunately, current techniques, like the circular coding technique above, may be limited in that they may require prohibitive amounts of storage and/or computation in order to encode and decode longer messages, since the resources required grow exponentially with the length of the codeword. For instance, if the scheme is implemented with a simple table including all the codewords packed in order, an 8 bit message encoder may require 384 bytes, a 16-bit message encoder may require 172 kilobytes, and a 32 bit message encoder may require 9.93 pedabytes. Thus, it may be difficult to represent messages made up of longer bit strings using techniques available today. In view of this shortcoming, disclosed herein are a system, non-transitory computer readable medium, and method for encoding and decoding data on a data bearing medium. In one example, a message comprising a bit string is read and a plurality of substrings in the message may be associated with a phase invariant codeword. In another example, a composite codeword comprising each phase invariant codeword associated with a substring from the message may be encoded in the data bearing medium. Rather than being limited by the resources required to define the mapping between messages and encoded codewords, the techniques disclosed herein allow longer messages to be encoded. In turn, longer strings of data may be represented with a phase-invariant scheme. For example, a 32 bit message encoder may be implemented with a memory structure requiring 360 kilobytes and producing length-44 composite codewords, or requiring 3.84 kilobytes and producing a length-60 codeword, depending on how many substrings are used to represent the message. The resulting composite codeword length and associated coding efficiency may vary based on the input parameters. The aspects, features and advantages of the present disclosure will be appreciated when considered with reference to the following description of examples and accompanying figures. The following description does not limit the application; rather, the scope of the disclosure is defined by the appended claims and equivalents.

FIG. 1 presents a schematic diagram of an illustrative computer apparatus 100 for executing the techniques disclosed herein. Computer apparatus 100 may comprise any device capable of processing instructions and transmitting data to and from other computers, including a laptop, a full-sized personal computer, a high-end server, or a network computer lacking local storage capability. Computer apparatus 100 may include all the components normally used in connection with a computer. For example, it may have a keyboard and mouse and/or various other types of input devices such as pen-inputs, joysticks, buttons, touch screens, etc., as well as a display, which could include, for instance, a CRT, LCD, plasma screen monitor, TV, projector, etc. Computer apparatus 100 may also comprise a network interface (not shown) to communicate with other devices over a network.

The computer apparatus 100 may also contain a processor 110, which may be any number of well known processors, such as processors from Intel® Corporation. In another example, processor 110 may be an application specific integrated circuit ("ASIC"). Non-transitory computer readable medium ("CRM") 112 may store instructions that may be retrieved and executed by processor 110. As will be discussed in more detail below, the instructions may include an encoder 114 and a decoder 116. In one example, non-transitory CRM 112 may be used by or in connection with any instruction execution system that can fetch or obtain the logic from non-transitory CRM 112 and execute the instructions contained therein.

Non-transitory CRM 112 may comprise any one of many physical media such as, for example, electronic, magnetic, optical, electromagnetic, or semiconductor media. More specific examples of suitable non-transitory computer-readable media include, but are not limited to, a portable magnetic computer diskette such as floppy diskettes or hard drives, a read-only memory ("ROM"), an erasable programmable read-only memory, a portable compact disc or other storage devices that may be coupled to computer apparatus 100 directly or indirectly. The non-transitory CRM 112 may also include any combination of one or more of the foregoing and/or other devices as well.

While only one processor and one non-transitory CRM are shown in FIG. 1, computer apparatus 100 may actually comprise additional processors and memories that may or may not be stored within the same physical housing or location. Furthermore, although all the components of computer apparatus 100 are functionally illustrated as being within the same block, it will be understood that the components may or may not be stored within the same physical housing.

The instructions residing in non-transitory CRM 112 may comprise any set of instructions to be executed directly (such as machine code) or indirectly (such as scripts) by processor 110. In this regard, the terms "instructions," "scripts," or "modules" may be used interchangeably herein. The computer executable instructions may be stored in any computer language or format, such as in object code or modules of source code. Furthermore, it is understood that the instructions may be implemented in the form of hardware, software, or a combination of hardware and software and that the examples herein are merely illustrative.

In one example, associations between phase invariant codewords and bit strings of a first length may be stored. Each phase invariant codeword may belong to a group of codewords having a particular property. In another example, encoder 114 may instruct processor 110 to read a message comprising a bit string of a second length longer than the first length. In yet a further example, encoder 114 may instruct processor 110 to divide the message into a plurality of substrings such that each substring may be smaller than the message of the first length. In other words, the substring may be of a shorter length than that of the original message. In another aspect, encoder 114 may instruct processor 110 to encode, on a data bearing medium, a composite codeword comprising each phase invariant codeword associated with a substring from the message.

Figure 2:
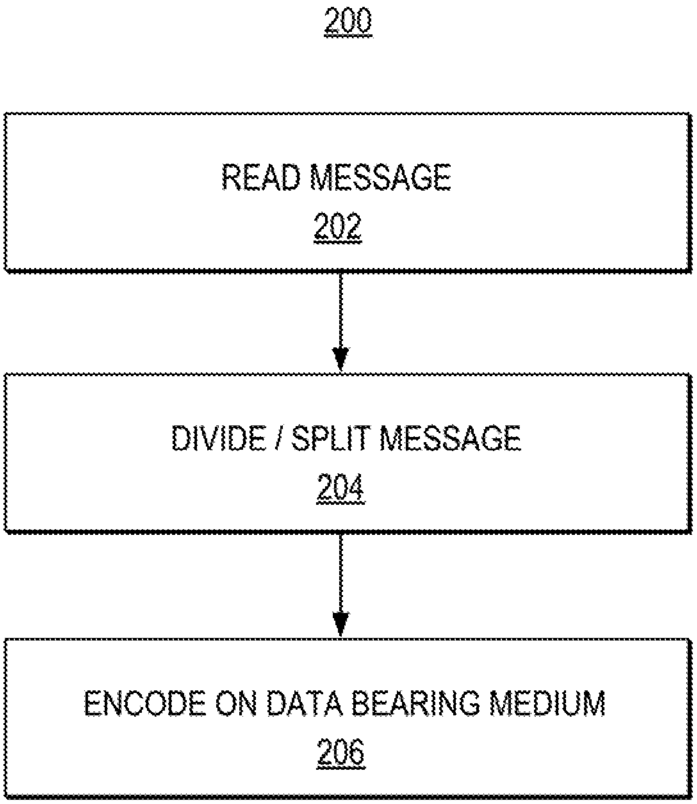
FIG. 2 is an example flow chart in accordance with aspects of the present disclosure.
Figure 4:
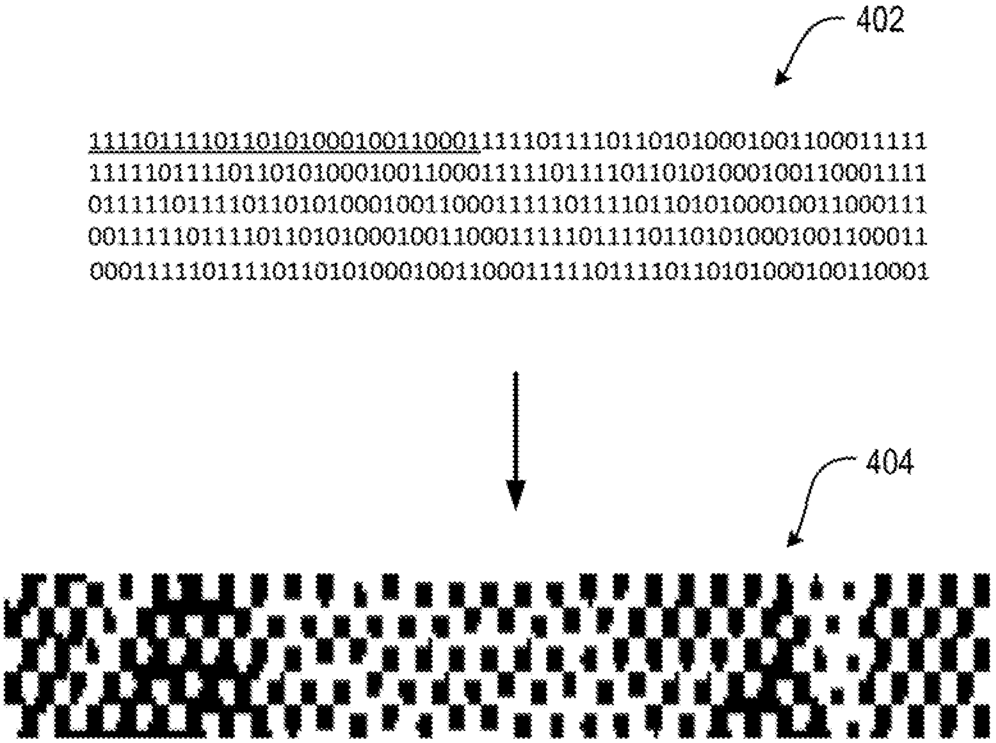
FIG. 4 is a working example of encoding a message on an image.

Working examples of the system, method, and non-transitory computer readable medium are shown in FIGS. 2-4. In particular, FIG. 2 illustrates a flow diagram of an example method 200 for encoding messages on data bearing media. FIGS. 3-4 show a working example in accordance with the techniques disclosed herein. The actions shown in FIGS. 3-4 will be discussed below with regard to the flowchart of FIG. 2.

In block 202 of FIG. 2, a message may be read. The message may be split or divided into a plurality of substrings, as shown in block 204. As noted above, each substring may be of a length shorter than that of the original message. Referring now to FIG. 3, an illustrative lookup table ("LUT") 300 is depicted. LUT 300 may be used to store associations between phase invariant codewords and message substrings. Column 302 contains illustrative phase invariant codewords and column 304 contains message substrings of a length shorter than that of the original message. In the example of FIG. 3, the substrings are of length two. Furthermore, the phase invariant codewords in column 302 are divided into four groups 306, 308, 310, and 312. Each phase invariant codeword in LUT 300 may belong to a group of codewords having a particular property. In the example of FIG. 3, the particular property is a range of values defining the number of active bits (e.g., the number of 1's) in the phase invariant codeword.

In one aspect, the number of codeword groups may be a power of two and the number of phase invariant codewords in each group may be a power of two. As noted above, the particular property in the example of FIG. 3 is a range of values defining the number of active bits in the phase invariant codeword of each group. Group 306 contains codewords with 2 or fewer 1's; group 308 contains codewords with three 1's; group 310 contains codewords with four 1's; and, group 312 contains codewords with five or more 1's. While the particular property of the example in FIG. 3 is the number of active bits, it is understood that any distinguishable property may be used.

By way of example, encoder 114 may read and encode the following message: 10010011. This message may be divided into the following four substrings: 10 01 00 11. The encoder 114 may search LUT 300 to obtain the phase invariant codeword associated with each smaller bit string divided from the message. In another aspect, encoder 114 may generate a composite codeword comprising each phase invariant codeword associated with a substring from the message. Thus, given the example above, the phase invariant codewords associated with each substring from the illustrative message are:

1010000 1101000 1110010 1111111

In the example above, a phase invariant codeword was selected from each group, however it is understood that any selection criteria may be used. For example, all phase invariant codewords may be selected from the same group or any combination of groups. In a further example, the phase invariant codewords above may be combined by regularly interspersing the symbols, to form a composite codeword:

1 1 1 1 0 1 1 1 1 0 1 1 0 1 0 1 0 0 0 1 0 0 1 1 0 0 0 1

Generally, phase invariant codewords of the following format:

$A_1A_2A_3A_4A_5A_6A_7$ $B_1B_2B_3B_4B_5B_6B_7$ $C_1C_2C_3C_4C_5C_6C_7$ $D_1D_2D_3D_4D_5D_6D_7$ may be interspersed to form the following composite codeword:

$A_1B_1C_1D_1A_2B_2C_2D_2A_3B_3C_3D_3A_4B_4C_4D_4A_5B_5C_5D_5$ $A_6B_6C_6D_6A_7B_7C_7D_7$

Referring back to FIG. 2, the composite codeword may be encoded on a data bearing medium, as shown in block 206. Referring now to FIG. 4, a series of composite codewords 402 is shown being encoded on an illustrative halftone image 404. The series of composite codewords 402 may be encoded by using circular shifting technique as described above. As noted above, the circular shifting technique may comprise an array of bits, wherein a certain number of the bits in the array repeat and where positions of the bits in each line (e.g., rows or columns) of the array of bits are circularly shifted from positions of the bits in an immediately preceding line. As also discussed above, this approach allows a portion of the data-bearing medium to include at least a shifted version of a set of bits representing the message, which, in the example of FIG. 4, is a composite codeword made up of phase invariant codewords from LUT 300, which allows for longer messages to be encoded.

In one example, decoder 116 may instruct processor 110 to read at least a portion of a composite codeword encoded on the data bearing medium and determine the substring associated with a phase invariant codeword in the composite codeword. In another aspect, decoder 116 may determine the group to which the phase invariant code word belongs in order to determine the substring associated with the phase invariant code word.

The table below compares storage amounts that may be required to encode and decode different message lengths. The first (leftmost) column displays different message lengths; the second column from the left shows an approximate amount of storage needed to store a message of a respective length using conventional techniques; the third column from the left shows an approximate amount of storage needed to store a message of a respective length using the techniques disclosed herein, when two groups of phase invariant codewords are utilized; finally, the fourth column from the left shows an approximate amount of storage needed to store a message of a respective length using the techniques disclosed herein, when four groups of phase invariant codewords are utilized. The table below illustrates how the techniques disclosed herein enable messages of a given length to be encoded using less storage to represent associations between codewords and message bits.

| Message bits | Storage required (conventional) | Storage (2 groups) | Storage (4 groups) |
|---|---|---|---|
| 8 | 384 bytes | 36 bytes | 14 bytes |
| 16 | 172 kilobytes | 832 bytes | 80 bytes |
| 24 | 60.8 megabytes | 18.4 kilobytes | 384 bytes |
| 32 | 9.93 pedabytes | 360 kilobytes | 3.84 kilobytes |

Advantageously, the above-described system, non-transitory computer readable medium, and method allow the encoding of longer messages on a data bearing medium. Rather than being limited by other conventional approaches, the techniques disclosed herein allow more flexibility by associating substrings in the message with different phase invariant codewords. In turn, longer messages may be encoded and users may be able to obtain even more information from data bearing media under the same constraints on computational resources.

Although the disclosure herein has been described with reference to particular examples, it is to be understood that these examples are merely illustrative of the principles of the disclosure. It is therefore to be understood that numerous modifications may be made to the examples and that other arrangements may be devised without departing from the spirit and scope of the disclosure as defined by the appended claims. Furthermore, while particular processes are shown in a specific order in the appended drawings, such processes are not limited to any particular order unless such order is expressly set forth herein. Rather, various steps can be handled in a different order or simultaneously, and steps may be omitted or added.

The invention claimed is:

1. A method of encoding a message, comprising:

reading a message comprising a bit string of a first length;

dividing the message into a plurality of substrings, each substring having a second length shorter than the first length;

determining a phase invariant codeword associated with each substring; and, generating a composite codeword comprising each phase invariant codeword.

2. The method of claim 1, wherein determining a phase invariant codeword associated with each substring comprises:

based on selection criteria, and where each of a number of groups of phase invariant codewords has a different property, selecting a group of phase invariant codewords having a particular property, wherein the particular property is a range of values defining the number of active bits in the phase invariant codeword of each group; and, selecting a phase invariant codeword associated with the substring from within the selected group of phase invariant codewords.

3. The method of claim 2, wherein the range of values is a single value.

4. The method of claim 2, wherein the selection criteria comprise a selection criterion chosen from phase invariant codewords being selected from a single group, and phase invariant codewords being selected from any combination of the groups.

5. The method of claim 1, wherein generating a composite codeword comprising each phase invariant codeword comprises:

interspersing each symbol of each phase invariant codeword with respective symbols of each of the other phase invariant codewords.

6. The method of claim 1, wherein determining a phase invariant codeword associated with each substring comprises:

searching a LUT (look up table) that comprises stored associations between phase invariant codewords and bit strings of the second length.

7. The method of claim 1, further comprising encoding the composite codeword on a data bearing medium.

8. The method of claim 7, wherein:

encoding the composite codeword comprises encoding the composite codeword as an array of bits;

a certain number of the bits in the array repeat; and, positions of the bits in each line row or column of the array of bits are circularly shifted from positions of the bits in an immediately preceding row or column.

9. The method of claim 7, further comprising:

reading a portion of the composite codeword encoded on the data bearing medium; and, determining a substring associated with a phase invariant codeword in the composite codeword.

10. The method of claim 7, further comprising:

reading a portion of the composite codeword encoded on the data bearing medium;

determining a group of phase invariant codewords to which a phase invariant code word in the composite codeword belongs; and, determining a substring associated with the phase invariant code word belonging to the group of phase invariant codewords.

11. A non-transitory computer-readable storage medium storing instructions that when executed by a processor, cause the processor to:

divide a bit string message of a first length into a plurality of substrings of a second length;

for each substring, select, from a number of groups of phase invariant codewords having different properties, a group of phase invariant codewords having a particular property, wherein the particular property is a range of values defining the number of active bits in the phase invariant codeword of each group; and, from each selected group, select a phase invariant codeword associated with the substring for which the group was selected.

12. The non-transitory computer-readable storage medium of claim 11, the instructions further causing the processor to:

generate a composite codeword comprising each of the selected phase invariant codewords;

and, encode the composite codeword onto a data bearing medium.

13. The non-transitory computer-readable storage medium of claim 12, wherein each phase invariant codeword comprises a string of bits, and wherein generating a composite codeword comprises:

interspersing each bit of each phase invariant codeword with a respective bit of each of the other phase invariant codewords.

14. The non-transitory computer-readable storage medium of claim 12, wherein encoding the composite codeword comprises encoding a series of composite codewords as an array of bits using circular shifting.

15. The non-transitory computer-readable storage medium of claim 14, wherein encoding composite codewords as an array of bits comprises encoding the array of bits as a halftone image on the data bearing medium.

* * * * *